United States Patent [19]

Spicer

[11] Patent Number: 4,538,127

[45] Date of Patent: Aug. 27, 1985

[54] MAGNETIC QUADRIPOLE

[75] Inventor: Denis F. Spicer, Bedford, England

[73] Assignee: Texas Instruments Incorporated, Dallas, Tex.

[21] Appl. No.: 263,611

[22] Filed: May 14, 1981

Related U.S. Application Data

[63] Continuation of Ser. No. 948,845, Oct. 5, 1978, abandoned.

[30] Foreign Application Priority Data

Oct. 31, 1977 [GB] United Kingdom ............... 45237

[51] Int. Cl.³ .............................................. H01F 7/00
[52] U.S. Cl. .................................................. 335/210
[58] Field of Search ............... 335/210, 213; 336/119, 336/129, 189, 225, 226, 227

[56] References Cited

U.S. PATENT DOCUMENTS

| | | | |
|---|---|---|---|
| 2,100,618 | 11/1937 | Urtel | 335/213 |
| 2,550,688 | 5/1951 | Gossick | 336/189 X |
| 4,107,582 | 8/1978 | Corpew | 335/213 X |

FOREIGN PATENT DOCUMENTS

| | | | |
|---|---|---|---|
| 2629019 | 1/1978 | Fed. Rep. of Germany | 335/213 |
| 1325540 | 8/1973 | United Kingdom . | |

*Primary Examiner*—Fred L. Braun
*Attorney, Agent, or Firm*—Douglas A. Lashmit; N. Rhys Merrett; Melvin Sharp

[57] ABSTRACT

A magnetic field generator having a conductor winding shaped to lie over the surface of a cylinder such that four pairs of straight conductor elements lie parallel to the axis of symmetry (Z axis) of the cylinder equally spaced around its periphery. These elements are joined by 90 degree arc conductor elements. The winding is such that in the straight elements of each pair, current flow is the same direction while in adjacent peripheral elements, current flow is in opposite directions so that the magnetic field due to the current flowing through the peripheral elements is zero on the Z-axis while the current flow through the straight elements forms a quadripole magnetic field about the Z-axis. Modifications of the structure can be made to provide for six-pole, 8-pole, 12-pole, etc., structures. In each case, a single conductor formed into an appropriate sequence of meanders can be used to produce the desired structure, thereby simplifying fabrication. Such structures have the advantage of reduced winding induction in relation to the magnetic field strength produced by the coil structure and are particularly suited for use in electron beam machines, for example, in the provision of an astigmatism correction coil.

2 Claims, 9 Drawing Figures

MAGNETIC QUADRIPOLE

This is a continuation of application Ser. No. 948,845 filed Oct., 5, 1978, now abandoned.

This invention relates to magnetic field generators. Magnetic field generators are used in devices which include a charged particle beam and in order to effect manipulation of the charged particle beam. The deflection and focussing coils used in the operation of cathode ray tubes are examples of magnetic field generators, their action being to generate a specific magnetic field in space in response to an electrical signal in order to effect deflection and shaping of the associated electron beam. Magnetic field generators are also used in ion beam devices for performing similar operations on the ion beam.

British Patent Specification No. 1,325,540 discloses electron beam apparatus which is intended for use in producing an exposed pattern on a resist, and describes the construction and operation of the component parts of such apparatus. One of the functions that needs to be performed in electron beam apparatus is control of the astigmatism of the electron beam, and in British Patent Specification No. 1,325,540, a magnetic field generator and its control system for this purpose are described in detail.

A magnetic field generator generally consists of at least one coil of electrical wire which is arranged to produce the required magnetic field when carrying an electrical current, and an associated magnetisable member which is arranged to provide a low-reluctance path for the magnetic flux which characterizes the magnetic field. The magnetic member is usually of a ferrous material, or more recently, a ferrite material. The magnetic member is often used as the means of supporting the electrical coil, and may be used as the coil former in order to provide a complete assembly.

When a magnetic field generator is energized by a varying electrical signal, some of the electrical energy absorbed by the magnetic field generator is taken up by its inductance, and consequently, not all of the electrical energy is used in establishing the desired magnetic field. It is desirable to minimize the electrical energy which is taken up by the inductance of the magnetic field generator, particularly in a magnetic field generator which is required to produce a continuously varying magnetic field, since the inductance acts to oppose changes in the energy supply to the magnetic field. If two magnetic field generators having substantially identical magnetic fields but different inductances are compared, the one having the lower inductance may be regarded as more efficient.

It is an object of the present invention to provide a magnetic field generator having improved efficiency over known magnetic field generators.

According to the present invention, a magnetic field generator includes a plurality of longitudinal electrical conductor pairs which lie substantially parallel with their ends positioned along respective first and second boundaries, the longitudinal electrical conductors being joined at the ends by means of sections of first and second peripheral electrical conductors, which lie along the respective boundaries, the longitudinal electrical conductors and the sections of the first and second peripheral electrical counductors being so arranged that an electrical current flowing through the said magnetic field generator is constrained to travel in the same direction in each pair of longitudinal conductors and in opposite directions in adjacent pairs of longitudinal conductors, and the said electrical current is further constrained to travel in opposite directions in adjacent sections of the peripheral conductors.

The magnetic field generator is preferably arranged as a series of meanders each having two long substantially straight sides and a short side joining the two long sides, the meanders being arranged to double back and thereby to appear as closed coils having two long substantially straight sides and two short sides, but wherein the short sides of each closed coil belongs to a different meander.

The magnetic field generator may be formed to define the surface of a solid figure, such as a cylinder, the longitudinal conductors being arranged to lie parallel with the axis of the solid figure, and the peripheral conductors being arranged to lie across the axis of the solid figure and along its surface.

In producing a magnetic field generator according to the invention, the device may be wound in the form of the solid figure or the device may be wound as a plane network which is then formed into a solid figure. The plane network would be an intermediate step in the manufacture of a magnetic field generator which is arranged as a solid figure, and would be a magnetic field generator in its own right, but having a different magnetic field from the finished device. For example, a magnetic field generator which is wound in the form of a cylinder could be reduced to a plane network by an operation which is equivalent to "developing" the surface of the cylinder into a plane rectangle, and the magnetic field generator would then fit into a plane rectangle. Alternatively, the magnetic field generator could be assembled as a plane network of rectangular shape and formed into a network of cylinderical shape.

The longitudinal electrical conductors may be arranged to lie along the surface of a cylinder and parallel to its axis, and the peripheral conductors may then lie along the boundaries of the circular surfaces forming the transverse ends of the cylinder.

The longitudinal conductors may be spaced symmetrically along the surface of the cylinder in order that the magnetic field generator should provide a symmetrical magnetic field.

The magnetic field may be identified according to the number of magnetic poles simulated by the field. For example, a magnetic field may be identified as 4-pole or quadripole. Magnetic fields simulating four poles are provided by four longitudinal conductor pairs, six poles are provided by six longitudinal conductor pairs, and so on. A four-pole or quadripole field is provided by spacing the longitudinal conductor pairs with a mechanical pitch of 90 degrees, and a six-pole field is provided by spacing the longitudinal conductor pairs with a mechanical pitch of 60 degrees.

The magnetic field generator may be provided by a single electrical conductor which is arranged as a series of meanders, which is arranged to have straight parallel portions corresponding to the longitudinal conductors, with the remainder of the single conductor being arranged as the peripheral conductors.

Magnetic field generators in accordance with the present invention, and their application, will now be described by way of example only, and with reference to the accompanying drawings, in which.

Figure 1:
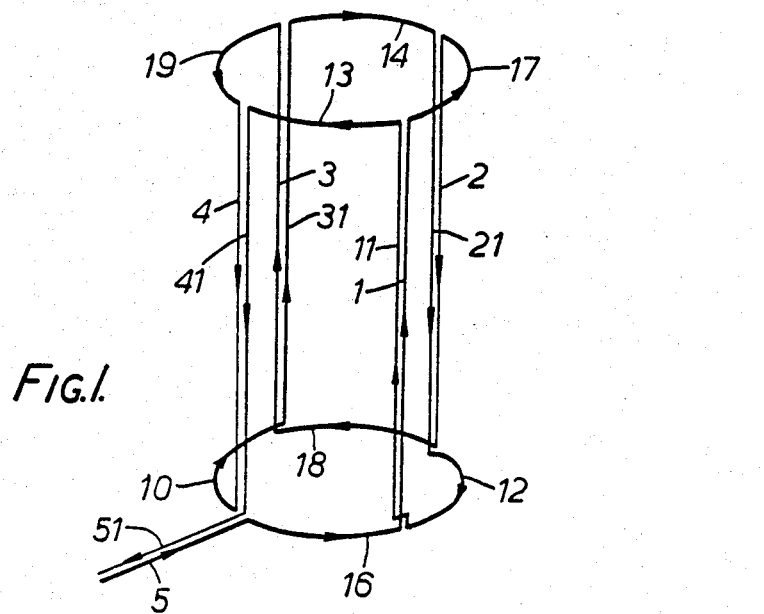
FIG. 1 shows a perspective view of a magnetic field generator which is arranged as a cylinder and which has four longitudinal conductor pairs.

Referring to FIG. 1, there is illustrated a quadripole magnetic field generator which includes four pairs of longitudinal electrical conductor pairs 1 and 11, 2 and 21, 3 and 31, and 4 and 41, which are arranged in space along the surface of a right cylinder and parallel to the cylinder axis. The longitudinal conductor pairs are arranged to be supplied with an electrical current by way of input conductors 5 and 51. The input conductor 51 is connected directly to the lower end of the conductor 41, and the input conductor 5 is connected to the lower end of the conductor 1 by way of a first section 16 of a first peripheral conductor, which lies along the boundary of a first circle formed by the intersection of the cylinder and a lower plane orthogonal to the cylinder axis. The upper end of the conductor 1 is joined to the upper end of the conductor 2 by way of a first section 17 of a second peripheral conductor which is arranged along the boundary of a second circle formed by the intersection of the cylinder and an upper plane orthogonal to the cylinder axis. The lower end of the conductor 2 is joined to the lower end of the conductor 3 by way of a second section 18 of the first peripheral conductor which lies along the boundary of the first circle, and the upper end of the conductor 3 is joined to the upper end of the conductor 4 by way of a second section 19 of the second peripheral conductor which lies along the boundary of the second circle. The lower end of the conductor 4 is joined to the lower end of the conductor 31 by way of a third section 10 of the first peripheral conductor which lies along the boundary of the first circle, and the upper end of the conductor 31 is joined to the upper end of the conductor 21 by way of a third section 14 of the second peripheral conductor, which lies along the boundary of the second circle. The lower end of the conductor 21 is joined to the lower end of the conductor 11 by way of a fourth section 12 of the first peripheral conductor which lies along the boundary of the first circle, and the upper end of the conductor 11 is joined to the upper end of the conductor 41 by way of an fourth section 13 of the second peripheral conductor which lies along the boundary of the second circle, the lower end of the conductor 41 being joined to the input conductor 51 in order to complete the network and to establish a single conductive path through the magnetic field generator. Preferably, the conductors 1-12, 21, 31, 41 and 51 are together defined by a single, continuous conductor. An electrical current entering the network by way of the input conductor 5 can therefore travel in an anti-clockwise direction along the first section 16 of the first peripheral conductor, upwards along the conductor 1, in an anti-clockwise direction along the first section 17 of the second peripheral conductor downwards along the conductor 2, in an anti-clockwise direction along the second section 18 of the first peripheral conductor, upwards along the conductor 3, in an anti-clockwise direction along the second section 19 of the second peripheral conductor, downwards along the conductor 4, in a clockwise direction along the third section 10 of the first peripheral conductor, upwards along the conductor 31, in a clockwise direction along the third section 14 of the second peripheral conductor, downwards along the conductor 21, clockwise along the fourth section 12 of the first peripheral conductor, upwards along the conductor 11, clockwise along the fourth section 13 of the second peripheral conductor, and downwards along the conductor 41 to leave by the input conductor 51. Therefore an impressed current flows in the same direction through the conductors of each conductor pair such as 1 and 11, in opposite directions in adjacent conductor pairs such as 1 and 11 and 2 and 21, and in opposite directions in the sections of the peripheral conductors such as 17 and 13 which lie adjacent to any conductor pair.

Figure 5:
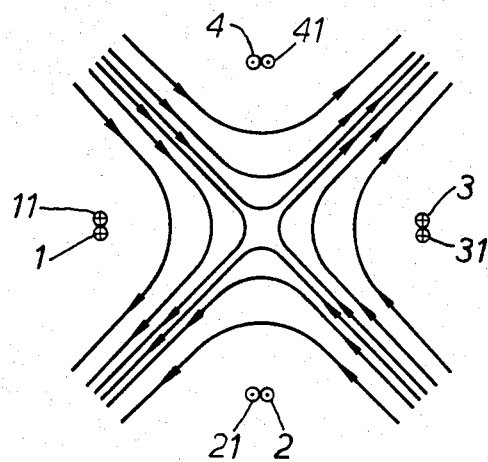
FIG. 5 shows a transverse cross-section of a magnetic field which is obtainable from a quadripole magnetic field generator according to the invention when excited by an electrical current.

The magnetic field produced in a plane orthogonal to the conductors 1 and 11, 2 and 21, 3 and 31, and 4 and 41, and remote from the peripheral conductors, is shown at FIG. 5. It can be seen that this field is similar to that which can be produced by means of four bar magnets when these are placed symmetrically in a circle with alternate magnets reversed. The magnetic field can therefore be identified as a quadripole magnetic field, and the magnetic field generator may be referred to as a quadripole magnetic field generator. There is no magnetic field in the immediate vicinity of the longitudinal axis of this magnetic field.

Figure 2:
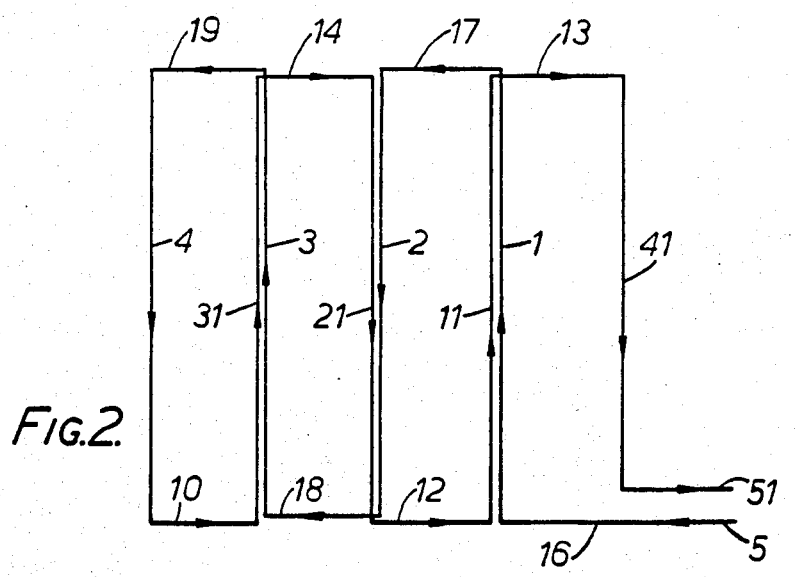
FIG. 2 shows the developed view of the magnetic field generator of FIG. 1 into a plane rectangular network of loops.

FIG. 2 represents a developed view of the magnetic field generator of FIG. 1. The network shown in FIG. 1 has been unwrapped from its cylindrical form and thereby becomes the plane network shown in FIG. 2, where the conductor pairs 1 and 11, 2 and 21, 3 and 31, and, 4 and 41, form parallel longitudinal conductor pairs, and are joined at one boundary by way of the peripheral conductor sections 16, 12, 18, and 10, and are joined at the other boundary by the peripheral conductor sections 13, 14, 17 and 19. The magnetic field generator shown in FIG. 1, may be wound as a plane network of the form shown in FIG. 2, and then formed into the shape of a cylindrical shell in order to cause the extreme longitudinal conductors 4 and 41 to lie together in the manner of the other conductor pairs.

The structure of FIGS. 1 and 2 may thus be described as two meanders, one meander comprising conductors 6, 1, 7, 2, 8, 3, 9 and 4; the other comprising conductors 10, 31, 14, 21, 12, 11, 13 and 41. The latter meander is doubled back over the former and is in antiphase therewith. Thus, the two meanders defined a series (four in FIGS. 1 and 2) of pseudo-loops, rectangular in shape with spaced parallel elongated sides defined by conductors of one meander (such as conductors 2 and 3) and spaced parallel bridge conductors, one from one meander and one from the other meander (such as conductors 8 and 11).

The number of longitudinal conductor pairs which are present in a magnetic field generator may be increased by shortening the pitch of the loops formed by the longitudinal conductor pairs and the peripheral conductors. A magnetic field generator having six pairs of longitudinal conductors is shown, in perspective, in FIG. 3.

Figure 3:
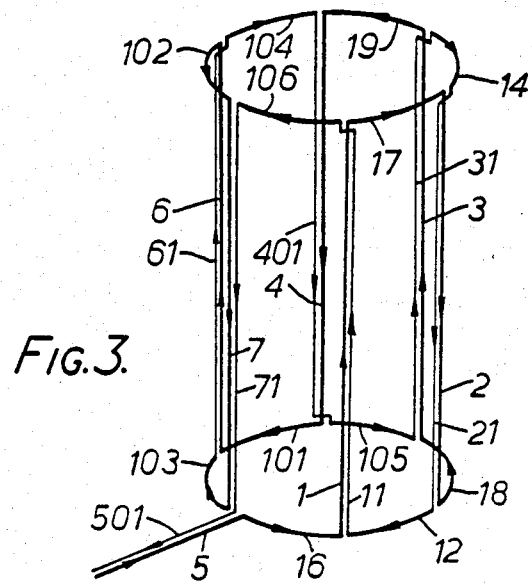
FIG. 3 shows a perspective view of a magnetic field generator having six longitudinal conductor pairs and arranged as a cylinder.

In FIG. 3, the conductor pairs 1 and 11, 2 and 21, and 3 and 31, are joined to the peripheral conductor sections 16, 17, 18, 19, 12, and 14 and the input conductor 5, as described with reference to FIG. 1. The conductor pairs 4 and 401, 6 and 601, and, 7 and 701, make up the additional longitudinal conductors, the bottom end of the conductor 4 being connected to the bottom end of the conductor 6 by way of a fifth section 101 of the first peripheral conductor, and the top end of the conductor 6 being connected to the top end of the conductor 7 by way of a fifth section 102 of the second peripheral conductor. The bottom end of the conductor 7 is connected to the bottom end of the conductor 61 by way of a sixth section 103 of the first peripheral conductor, and the top end of the conductor 61 is connected to the top end of the conductor 401 by way of a sixth section 104 of the second peripheral conductor. The bottom end of the conductor 401 is connected to the bottom end of the conductor 31 by way of a seventh section 105 of the first peripheral conductor, after which the network proceeds as described in relation to FIG. 1, until the last section 106 of the second peripheral conductor connects the top end of the conductor 11 to the top end of the conductor 71 which has its bottom end connected to the second input conductor 501.

The six conductor pairs of FIG. 3 are also arranged to form a cylindrical shell, and provide a six-pole magnetic field in a plane orthogonal to the cylinder axis and remote from the peripheral conductors. The cylindrical shell network may be developed into a plane network which has the conductors 7 and 71 lying at opposite ends of it.

Figure 4:
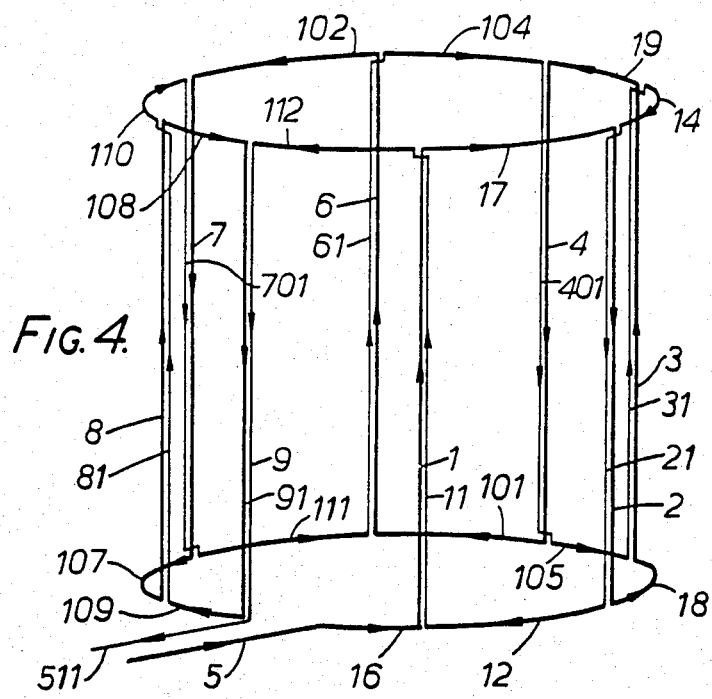
FIG. 4 shows a perspective view of a magnetic field generator having eight longitudinal conductor pairs and arranged as a cylinder.

Instead of four, or six conductor pairs, there may be eight conductor pairs as illustrated in FIG. 4. In this illustration, the conductor pairs 1 and 11, 2 and 21, 3 and 31, 4 and 401, and 6 and 61, correspond to similarly numbered conductors in FIG. 3, and the peripheral conductor sections 16, 17, 12, 18, 14, 19, 105, 104 and 102 correspond to similarly numbered peripheral conductor sections in FIG. 3. The input conductor 5 also corresponds to the input conductor of FIG. 3. Of the remaining conductor pairs of FIG. 4, the lower end of the conductor 7 is connected to the lower end of the conductor 8 by way of an eighth section 107 of the first peripheral conductor, and the upper end of the conductor 9 8 is connected to the upper end of the conductor 9 by way of an eighth section 108 of the second peripheral conductor. The lower end of the conductor 9 is connected to the lower end of the conductor 81 by way of a ninth section 109 of the first peripheral conductor and the upper end of the conductor 81 is connected to the upper end of the conductor 701 by way of a ninth section 110 of the second peripheral conductor. The lower end of the conductor 701 is connected to the lower end of the conductor 61 by way of a tenth section 111 of the first peripheral conductor, and from then onwards the network proceeds as described with reference to FIG. 3, until the last peripheral conductor section 112 connects the upper end of the conductor 11 to the upper end of the donductor 91. The lower end of the conductor 91 is connected to the second input terminal 511.

The eight-pole magnetic field generator shown in FIG. 4, is arranged as a cylindrical shell network, which may be manufactured as a plane network, as described with reference to FIG. 2, and subsequently formed into the cylindrical shell shown.

Figure 6:
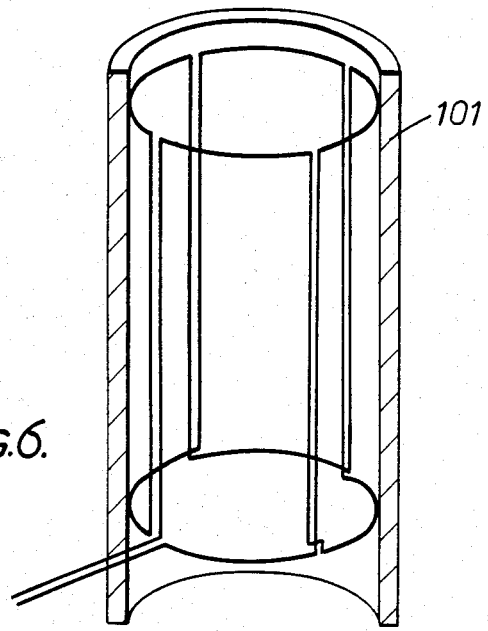
FIG. 6 shows a part longitudinal cross-section of a magnetic field generator enclosed in a magnetic tube.

The magnetic field generator described may be closed within a tight-fitting tube of magnetic material in order to provide magnetic paths with reduced reluctance, and thereby increase the generated magnetic field. A magnetic field generator may provide twice the field strength within it when this arrangement is adopted and in comparison with the field strength at the same point in air. Such an arrangement is illustrated in FIG. 6 where a magnetic field generator similar to that shown in FIG. 1 is shown enclosed in a magnetic tube 101. The magnetic tube may be made of a ferrite material of the type appropriate to the working flux density of the device and the frequency of operation.

Figure 7:
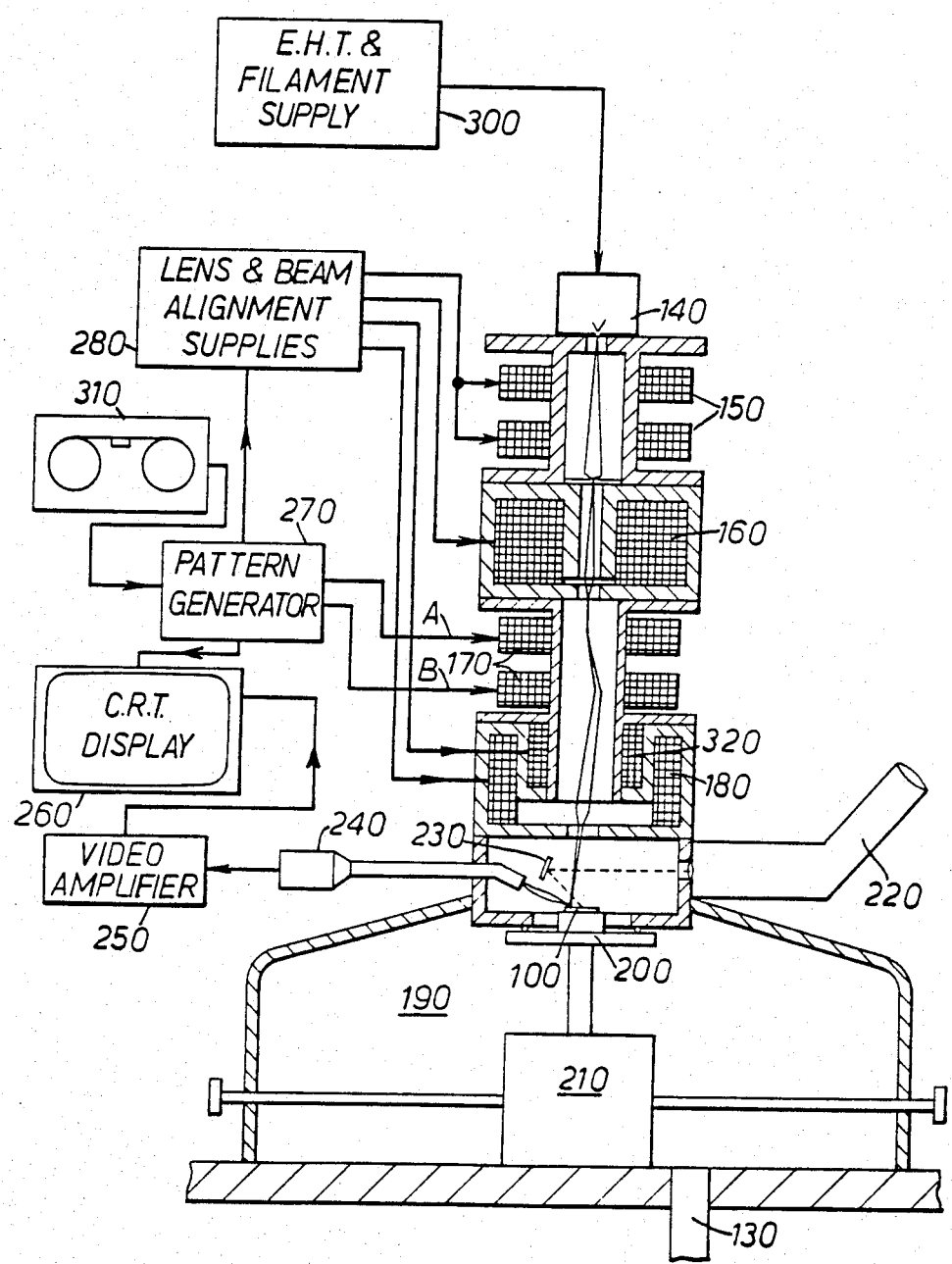
FIG. 7 shows a longitudinal cross-section of an electron beam machine on which magnetic field generators according to the invention may be used.

An application of a magnetic field generator according to the invention may be better understood by reference to FIG. 7 of the accompanying drawings. The machine illustrated in FIG. 7 is an electron beam machine which is suitable for selective exposure of a photo resist pattern, and includes an electron gun 140 which generates electrons for use in the machine. Electrons from the electron gun 140 pass alignment and blanking coils 150 and reach a condenser lens 160. From the condenser lens 160, the electron beam passes through X and Y deflection coils 170 and into an astigmatism corrector 320, then proceeds onward to a magnetic objective lens 180. In the work chamber 190, which forms part of the evacuated space of the apparatus, a work table 200 is provided, and on this is placed a semiconductor wafer 100 having a photo-resist covered surface which is to be processed. The work table 200 is mounted on a mechanical stage 210 by means of which the work table 200 can be moved by controls located outside the work chamber 190. The objective lens 180 serves to focus the electron beam onto the wafer 100. For the rough alignment of the wafer in the machine, there is provided an optical microscope 220 through which the surface of the wafer 100 can be observed with the aid of a mirror 230. There is provided a single channel electron multiplier 240 which is arranged to pick up secondary electrons emitted from the surface of the wafer 100, and which provides a video signal in response to marking formed on the surface of the wafer 100. The video information is presented on a cathode ray tube display 260. A pattern generator 270 provides X and Y axis deflection signals to the deflection coils 170 and also to the cathode ray tube display 260, and in addition, the pattern generator 270 provides beam blanking signals and focus correction signals for the lens and the beam alignment supply circuits 280. The circuits 280 provide the necessary currents and voltages for focussing the electron beam onto the surface of the wafer 100, correcting astigmatism in the lens, aligning the beam from the electron gun with the lenses, and for blanking the beam. A unit 300 provides the extra high tension and filament supplies for the electron gun, and a punched tape reader 310 is provided for supplying, a digital form, signals to the pattern generator 270.

The astigmatism correction coils 320 embody the present invention and may be located at any one of several positions along the electron beam column. Suitable positions are between the deflection coils and objective lens (as shown in FIG. 7), between the condenser lens and the deflection coils, or between the condenser lens and the objective lens (with the deflection coils following the objective lens). Preferably, the electron beam should pass through the astigmatism corrector before deflection in order to avoid the astigmatism corrector influencing the deflection, since the beam is then not always at the center of the corrector. No "rotation" of the deflection signals is required if the astigmatism corrector and the deflection coils are adjacent and neither lies within the lens field.

Figure 9:
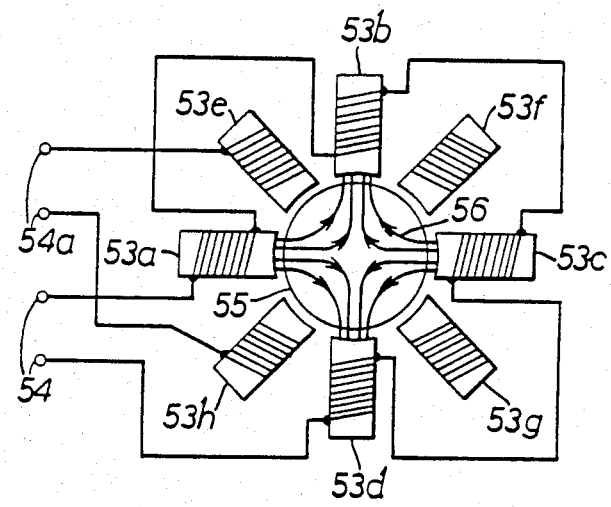
FIG. 9 shows a transverse cross-section of the field which is used in astigmatism control of the electron beam for the machine of FIG. 7.

The magnetic field of a conventional quadripole magnetic field generator is shown in FIG. 9. The conventional arrangement takes the form of four electromagnets 53a, 53b, 53c, and 53d which are placed symmetrically within a circle with alternate north and south poles facing radially inwards. The coils are connected in series and are accessible by way of an input port 54. When the coils are energised, a circular transverse cross-section electron beam passing axially through the magnetic poles will be distorted into an ellipse and conversely, an elliptical transverse cross-section beam may be distorted into a circle. It will be appreciated that a conventional system has a considerable volume and mass, as compared with a system embodying the present invention while comparison of the magnetic fields shown in FIGS. 5 and 9 will confirm that they are substantially identical. In addition, the inductance of the known magnetic field generator may be of the order of 1 millihenry, whereas the invention provides a coil of inductance of the order of 7 microhenries.

Figure 8:
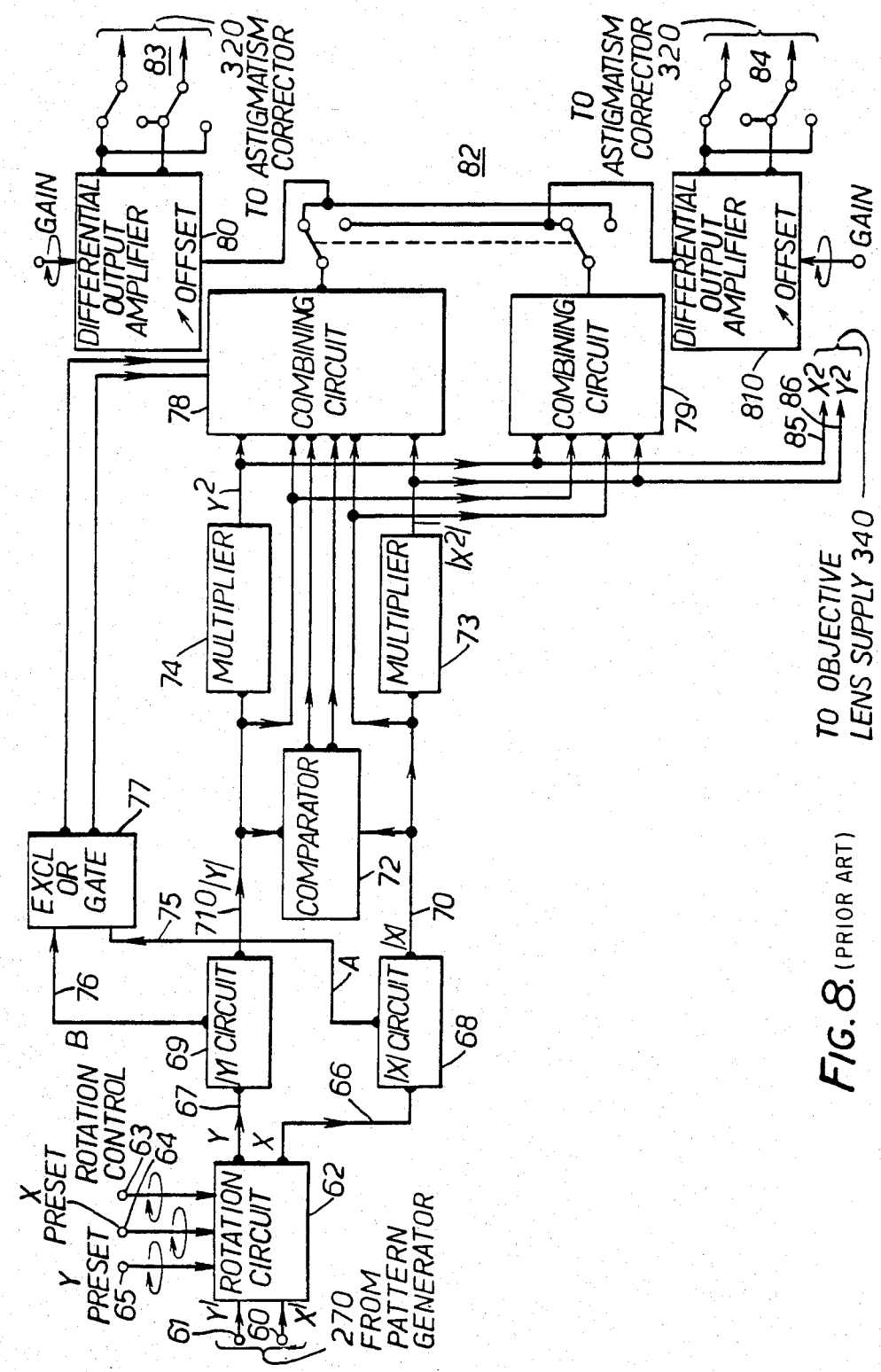
FIG. 8 shows a block diagram control system for control of focussing an astigmatism of the electron beam for the machine of FIG. 7.

The astigmatism correction waveform needs to be controlled in relation to the focussing and deflection waveforms of an electron beam machine, and FIG. 8 represents a known form of achieving this as described in the above-mentioned U.K. Pat. No. 1,325,540. The parts of FIG. 8 relevant to the correction astigmatism will be discussed briefly, a more complete discussion being available by reference to the above-mentioned U.K. Pat. No. 1,325,540.

In FIG. 8, deflection voltages $X^1$ and $Y^1$, corresponding to the voltages which are applied to the deflection coils of the system, are applied to a rotation circuit 62 which applies a correction to the waveforms to correct for the rotation of the deflection which is caused by the objective lens 180. This part of the system is not required where the astigmatism corrector 320 lies outside the field of the objective lens 180 and on the same side of it as the deflection coils 170. The output signals from the rotation circuit 62 are then applied to a /X/ circuit 68 and a /Y/ circuit 69, which performs the function of providing /X/ and /Y/ respectively, and the signals /X/ and /Y/ are then applied to respective multipliers 73 and 74 in order to provide $/X/^2$ and $/Y/^2$. At the same time, a comparator 72 is arranged to receive /X/ and /Y/ and to decide which is the larger and to communicate the result of the comparison to a combining circuit 78. The output signals $X^2$ and $Y^2$ are also fed to the combining circuit 78 and to a secon combining circuit 79. The combining circuit 78 is arranged to drive one of two differenctial amplifiers 80 and 810, and so is the second combining circuit 79. A cross-over switch 82 is arranged to effect reversal of the combining means amplifier connections. An EXCLUSIVE-OR gate 77 is connected to the /X/ circuit 68 and the /Y/ circuit 69, and acts to indicate whether the signs of the X and Y signals are the same or not. The EXCLUSIVE-OR gate output signal is arranged to control the operation of the combining circuit 78. This circuit arrangement of FIG. 8 functions to provide output signals corresponding to $\pm\sqrt{2}\ a(X^2+Y^2)+$(the smaller of /X/ and /Y/), and $a(/Y/-/X/)(X^2+Y^2)$, where a is a multiplying factor determining the amount of correction. The equations represent, respectively, the diagonal astigmatism correction required and the axis astigmatism correction required. The full meaning of the equations given above may be obtained by reference to U.K. Pat. No. 1,325,540. The signals corresponding to these equations are required for controlling the operation of an astigmatism corrector in an electron beam machine.

Some advantages, provided by a magnetic field generator according to the invention compared with conventional generators are:

a. Construction is simpler and easier and greater accuracy can be achieved, which makes it possible to construct physically smaller magnetic field generators.

b. Intense magnetic fields can be generated with low coil inductance, because of the relatively small amount of magnetic material employed, this being important where dynamic focussing of a beam is used, as in electron-beam microfabrication machines.

c. A number of field generators may be interleaved in order to yield a greater number of poles. For example, a 12-pole field may be provided by the use of three 4-pole generators placed at appropriate orientations.

It will be appreciated that although the embodiments described with reference to a solid network have been cylindrical in form, the invention is not limited to cylindrical solid networks. The construction disclosed permits the manufacture of magnetic field pattern generators in which the longitudinal conductors are arranged along the peripheries of solid forms having rectangular, triangular or elliptical transverse cross-sections, for example.

The method may also be employed in the manufacture of the main beam focussing coils in the electron beam apparatus discussed above, and in the manufacture of generally similar coils for other applications. The material of the coils is any low resistance material. Copper is usually employed. The coils may be provided by printed circuit techniques, either by the use of a flexible printed circuit which is subsequently formed to define the surface of a solid cylinder, or by forming the printed pattern on a tube of the appropriate shape. It should be noted that, if a printed circuit technique is used, steps will need to be taken in order to provide crossovers.

What we claim is:

1. A cylindrical coil structure comprising a single continuous conductive path having first and second portions each disposed in a meander around the axis of symmetry of said cylindrical coil structure and including equispaced longitudinal conductor sections parallel to said axis of symmetry joined by bridge conductor sections extending transversely of said axis of symmetry at ends of said cylindrical coil structure, wherein said meanders of the first and second portions extend in antiphase to each other such that longitudinal conductor sections of the first and second portions overly each other in pairs and corresponding bridge conductor sections of the first and second portions together define substantially closed peripheries at opposite ends of said longitudinal conductor sections to form a series of pseudo-loops each comprising spaced first and second pairs of longitudinal conductor sections, each of the first and second pairs including a longitudinal conductor section of each meander, and a pair of bridge conductor sections one of each meander for constraining current flow along said continuous conductive path in one direction along the longitudinal conductor sections of the second pair, and in opposite directions through adjacent bridge conductor sections of the first and second portions.

2. Electron beam deflection apparatus comprising means for directing an electron beam along a beam axis toward a target area, means for deflecting said beam away from said axis, and an improved low self-inductance means for correcting astigmatism of said electron beam comprising:

a coil structure having a single continuous conductive path with first and second portions each disposed in a meander to define a cylindrical surface around said beam axis and including equispaced longitudinal conductor sections parallel to said beam axis joined by bridge conductor section extending transversely of said beam axis at ends of said cylindrical surface, wherein said meanders of the first and second portions extend in antiphase to each other such that the longitudinal conductor sections of the first and second portions overly each other in pairs and corresponding bridge conductor sections of the first and second portions together define substantially closed peripheries at opposite ends of said longitudinal conductor sections to form a series of pseudo-loops each comprising spaced first and second pairs of longitudinal conductor sections, each of the first and second pairs including a longitudinal conductor section of each meander and a pair of bridge conductor sections one of each meander for constraining current flow along said continuous conductive path in one direction along the longitudinal conductor sections of said first pair, in an opposite direction along the longitudinal conductor sections of the second pair, and in opposite directions through adjacent bridge conductor sections of the first and second portions; and a tubular member of magnetic material enclosing said coil structure.

* * * * *